United States Patent [19]

Rogers et al.

[11] 4,028,633
[45] June 7, 1977

[54] DRIVE CONTROL TO PREVENT SIMULTANEOUS CONDUCTION IN PUSH-PULL SWITCHING AMPLIFIER

[75] Inventors: Jimmy Dale Rogers, Dallas; Michael Earl Creecy, Richardson, both of Tex.

[73] Assignee: The United States of America as represented by the Secretary of the Navy, Washington, D.C.

[22] Filed: July 19, 1976

[21] Appl. No.: 706,410

[52] U.S. Cl. .................... 330/118; 330/207 A
[51] Int. Cl.² .................................. H03F 3/28
[58] Field of Search .......... 330/10, 15, 118, 207 A; 307/242; 328/152

[56] References Cited

UNITED STATES PATENTS 3,825,773   7/1974   Kivistik ..................... 330/15 X

*Primary Examiner*—James B. Mullins
*Attorney, Agent, or Firm*—R. Sciascia; R. Beers; S. Sheinbein

[57] ABSTRACT

A drive circuit responsive to the phase of the amplifier output current ensures that the non-conducting amplifier element remains off while the other amplifier element conducts. The output current phase can be detected either from the individual amplifier element outputs or from their combined outputs. Adjustments are made to compensate for any phase shift which occurs between the input to the amplifier and the point in the output at which the phase is detected.

14 Claims, 2 Drawing Figures

DRIVE CONTROL TO PREVENT SIMULTANEOUS CONDUCTION IN PUSH-PULL SWITCHING AMPLIFIER

BACKGROUND OF THE INVENTION

This invention relates generally to switching amplifiers and more particularly to preventing simultaneous conduction of the individual amplifier elements in a push-pull switching amplifier.

The use of push-pull switching amplifiers in a square wave or pulse type of operation has proven to be an effective means of achieving high efficiencies in amplifiers as well as inverters. In their basic form of operation, the two individual amplifier elements, which may be vacuum tubes or semiconductors, are alternately switched at a fundamental frequency to conduct an input signal for 180° intervals. A modification of this which exhibits high efficiencies is the use of Class S amplifiers which use some form of pulse width modulation (PWM), pulse duration modulation (PDM) or time-ratio controlled modulation to superimpose a higher switching frequency upon the fundamental frequency. The higher switching frequency causes each one of the amplifier elements to switch on and off several times during each of its half cycles of the fundamental frequency. *Principles of Inverter Circuits* by B. D. Bedford and R.G. Hoft, published by John Wiley and Sons, 1964 gives a good illustration of typical equations and waveforms R. G. Class S amplifiers on pages 256–262.

One problem which exists in push-pull switching amplifiers is simultaneous conduction by the amplifier elements rather than the desired purely alternate operation. Simultaneous conduction occurs during switching because stray, lumped and distributed capacitances in the amplifier discharge through the amplifier element if it is driven even through that particular amplifer element cannot contribute useful power during that portion of the fundamental frequency period. This conduction represents a power loss to the amplifier and reduces its efficiency. The problem tends to be worse in Class S amplifiers because there are more switching intervals.

Previously, proposals have been made to eliminate simultaneous conduction in push-pull amplifiers. One such proposal has been the use of a drive circuit to enable one amplifier element while inhibiting the other. The drive is based on a feedback signal from the amplifier output which indicates which amplifier element is on at the moment. As long as it remains on, the other amplifier element will be inhibited. When the conductive element completely shuts off, the other element is allowed to conduct and the original element is inhibited. U.S. Pat. Nos. 3,448,395 and 3,825,773 use this type of drive circuit. These devices, while useful, have failed to provide any control of the drive based on the phase of the amplifier output signals. Such an omission can lead to inefficiencies in operation if there has been a phase shift between the amplifier input and output. Such phase shifts are common across the amplifier elements, especially in the plate circuits of high-power vacuum tubes. Further phase shifting can occur across the output transformer if one is used and/or across output filter components if they are used.

SUMMARY OF THE INVENTION

Accordingly, there is provided a drive circuit which controls the drive to the individual amplifier elements in accordance with the phase of the amplifier output current. The phase can be sensed either directly at the outputs of the individual amplifier elements or at a point after the individual output currents have been combined to form the amplifier output. A control circuit provides enable and inhibit signals to the proper amplifier elements to prevent simultaneous conduction in accordance with the detected output current phase. Any phase shifts which have occurred between the amplifier input and sensing can be compensated for by adjusting the phase to which the control circuit will respond in accordance with the known phase shift. Such compensations can include any amplifier element, output transformer, and filter phase shifts which may occur in the amplifier.

OBJECTS OF THE INVENTION

It is therefore an object of the present invention to provide a push-pull switching amplifier with improved efficiency.

Another object of the present invention is to provide an improved drive control to prevent simultaneous conduction in push-pull amplifiers.

A further object of the present invention is the provision of phase compensation in a simultaneous conduction prevention circuit.

Still another object of the present invention is the reduction of drive power requirements by the efficient prevention of simultaneous conduction in Class S switching amplifiers.

A still further object of the present invention is prevention of power loss through stray, lumped and distributed capacitances by elimination of their discharge path to ground.

BRIEF DESCRIPTION OF THE DRAWINGS

These and other objects, features and attendant advantages of the present invention will become better understood by reference to the following detailed description when considered in connection with the accompanying drawings wherein.

DETAILED DESCRIPTION OF THE PREFERRED EMBODIMENT

Figure 1:
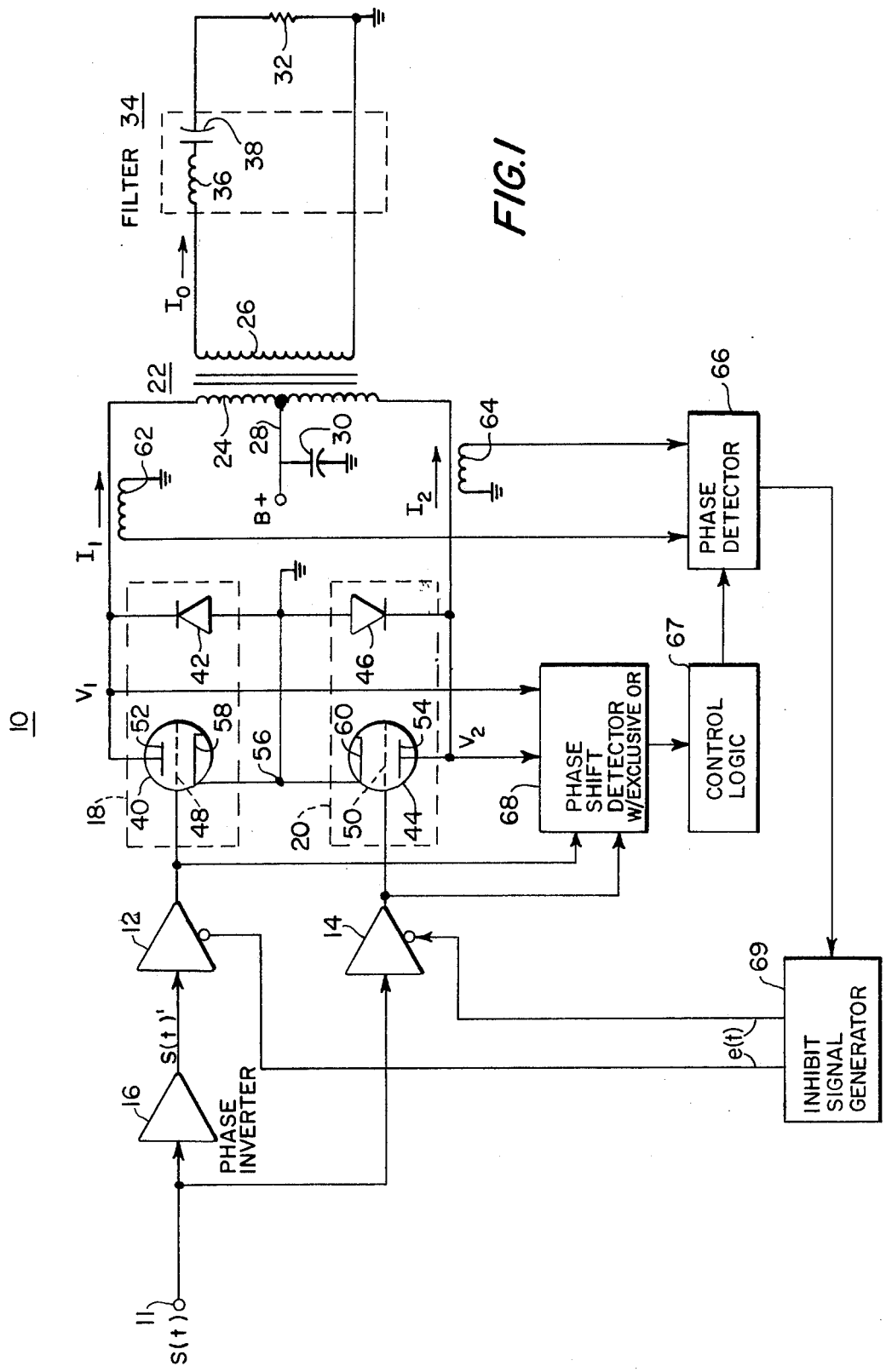
FIG. 1 shows a partial block and a partial schematic diagram of a first embodiment of a drive circuit according to the invention.

Referring now to the drawings wherein like reference numerals designate identical or corresponding parts through the several views, and more particularly to FIG. 1, there is shown a push-pull switching amplifier 10 having an input terminal 11 to which an input signal $s(t)$ is applied. Input signal $s(t)$, which consists of a series of pulses, is applied to first drive means 12 via phase inverter 16 and directly to second drive means 14. Phase inverter 16 is provided to provide an inverted input signal $s(t)'$, the complement of $s(t)$, to first drive means 12 to be 180° out of phase with the input signal $s(t)$ to second drive means 14. The term 180° as used here for the complement of $s(t)$ should not be confused with the concept of a 180° phase shift of the fundamental component. The difference is particularly significant in Class S amplifiers. Any conventional technique for inverting the input signal, such as a center-tapped transformer may be employed to provide the phase inversion. In fact, $s(t)$ could be generated as two separate signals in a computer in which case the phase inverter function would be performed in the computer. First drive means 12 couples the phase inverted input signal $s(t)'$ to first amplifier element 18, while second drive means 14 couples the non-inverted input $s(t)$ to second amplifier element 20. Drive means 12 and 14 serve as gates to amplifier elements 18 and 20 and will only pass the respective input signal $s(t)'$ and $s(t)$ when the drive means are enabled, and as such, any conventional gate means capable of switching between an enable and an inhibit mode may be employed.

The outputs of amplifier elements 18 and 20 are coupled to primary coil 24 of an output transformer 22 and combined thereby. The D.C. power supply B+ is coupled to primary coil 24 center tap 28, with D.C. supply filter capacitor 30 coupled thereto serving as a filter for the B+ supply. Secondary coil 26 of transformer 22 couples the combined output current $I_o$ to a load 32 after passing through a conventional 34. Typically, filter 34 would be a simple L-C network as shown with inductor 36 and capacitor 38, but any other conventional arrangement could be utilized. Although the output of amplifier 10 has herein been shown as a transformer arrangement across both amplifier elements 18 and 20, it is to be understood that any conventional ouput for a push-pull amplifier could be used. This would include the so-called "single-ended" push-pull output with the primary coil of a transformer coupled only across one of the amplifier elements. Also, the output could be a simple capacitive coupling.

Solely for purposes of illustration, the amplifier elements 18 and 20 are shown to comprise tube and semiconductor diode combinations of 40, 42 and 44, 46 respectively. Any tube or semiconductor device or combination thereof commonly used in the art for push-pull switching amplifers could be utilized. The phase-inverted input signal $s(t)'$ is fed to the input electrode 48 of tube 40 of element 18 at a voltage equal to, but 180° out of phase, with that fed to input electrode 50 of tube 44 of element 20. After amplification in accordance with the particular characteristics of vacuum tubes 40 and 44, the signals are outputted on output electrodes 52 and 54 respectively. Vacuum tubes 40 and 44 share a common terminal 56 connecting their grounded electrodes 58 and 60 to ground. First and second shunt diodes 42 and 46 are coupled with their respective cathodes to output electrodes 52 and 54 respectively, and their anodes to the common ground terminal 56. This serves to limit the maximum negative voltage swing allowed across vacuum tubes 40 and 44.

In normal push-pull operation the switching elements 18 and 20 alternately conduct input signals $s(t)'$ and $s(t)$, respectively, for 180° intervals at a desired fundamental frequency. If a Class S operation is desired, each element will alternately conduct several times during its respective half cycle of the fundamental period, thus giving a higher frequency superimposed upon the fundamental frequency. Customarily, some form of pulse width modulation (PWM), pulse duration modulation (PDM), or time-ratio controlled modulation is used in Class S amplifiers to achieve high efficiency. In systems that have a switching rate equal to the fundamental frequency, the primary switching function is obtained by tubes 40 and 44 alternately conducting for 180° intervals. In Class S amplifiers, which commonly have filters with inductive input characteristics, the primary switching function is obtained by tube 40 and second shunt diode 46 alternately conducting several times during a half cycle of the fundamental period and then tube 44 and first shunt diode 42 alternately conducting.

Filter 34 is normally designed such that the current in the secondary winding 26 of the output transformer reverses direction at the fundamental frequency rate regardless of whether or not a higher Class S switching rate is used. In such a system, only one of the tubes 40 or 44 can contribute useful power during each half cycle of the fundamental frequency. The inductive load characteristic forces current to flow through second shunt diode 46 instead of tube 44 during the half cycle that tube 40 is contributing to the output power. A problem exists, however, in that some current flows through tube 44 during this half cycle, if drive is applied to its input terminal due to the energy stored in stray, lumped and distributed capacitances present in amplifier 10. These capacitors are discharged through tube 44 in short current pulses during the switching intervals causing simultaneous conduction of tubes 40 and 44 and/or conduction of tube 44 when it cannot contribute to useful power output. The energy contained in these pulses represents a power loss. The current that flows through shunt diode 46, however, is pumped back into the high voltage power supply filter capacitor 30. The associated energy is therefore stored instead of being dissipated. When tube 44 begins conducting during its half of the fundamental frequency, the situation reverses with capacitive discharge through tube 40 providing a power loss if drive is applied to its input terminal.

The inclusion of elements 62-72, to be discussed hereinafter, resolve this problem of power lost from switching on a tube during the interval that it cannot contribute to the useful power output. First and second sensors 62 and 64 located to monitor the output currents $I_1$ and $I_2$ from first and second switching elements 18 and 20, respectively are coupled to phase detector 66 which measures their phases. The measured phase of phase detector 66 is coupled to inhibit signal generator 69 to provide an inhibit signal $e(t)$ to one of first or second drive means 12 and 14 based on the phase measurement.

Only one of the output currents $I_1$ or $I_2$ will be present as a substantial current flow at any given moment of time inasmuch as the amplifier elements 18, 20 conduct the input signal $s(t)$ alternately. Therefore, phase detector 66 will effectively be monitoring only one of the output currents $I_1$ or $I_2$ at a given moment, the particular one being determined by which amplifier element is conducting.

In a situation where no phase shift occurs in amplifier 10 between the input terminal 11 and the point where output currents $I_1$ and $I_2$ are sensed, inhibit signal generator 69 will switch the inhibit signal from one of drive means 12 and 14 to the other whenever phase detector 66 indicates that the output currents $I_1$ or $I_2$ being monitored indicate a zero crossing point of the fundamental frequency has been reached. At this point the phase will be either 0° or 180°, and the amplitude zero. Assuming that the output is in perfect phase match with the input, when the output current is at a zero crossing the input signal will be completing one half cycle of the fundamental frequency. At that moment, the inhibit signal $e(t)$ if switched to turn off the drive means which had just been conducting, and allow the previously inhibited drive means to pass the input signal $s(t)$ or $s(t)'$.

If often happens that some phase shift occurs in amplifier 10 between input terminal 11 and the sensor location causing the phase of $V_1$ and $V_2$ to be out of phase with the input signals by some difference other than the normal 180° and $I_2$ respectively. Typically, such phase shift can occur across amplifier elements 18, 20. This is especially true of the plate circuits of high-power amplifiers if the amplifier uses inductors and/or capacitors as filter elements.

To correct for this phase shift, a phase shift detector 68 is provided to determine the voltage phase shift between input terminal 11 and tube output electrodes 52 and 54. The input signal $s(t)$ voltages (which are in-phase with the input signal currents) are sensed at the input to amplifier elements 18 and 20 and are provided, along with the voltage sensed at the outputs of amplifier elements 18 and 20, to phase shift detector 68. By virtue of having the voltage readings at the input and output of amplifier elements 18 and 20, phase shift detector 68 can give an indication of the amplifier delay which caused the phase shift of the voltages. Two EXCLUSIVE OR gates (each connected to both the input and output voltages of one of the amplifier elements 18 or 20) would be one means of implementing this indication by giving an output if and only if one of the input and output voltage signals for the amplifier element being monitored at the time is present. The width of the pulse output of phase shift detector 68 is equal therefore, to the amplifier element delay. Since phase shift through the switching amplifier will always be small and in the form of delay, there is no ambiguity as to which direction to correct for phase shift. By integrating the signal out of an EXCLUSIVE OR gate in control logic circuit 67 one can derive a bias level porportional to the amplifier delay. This voltage can then be used to bias the phase detector 66 such that the phase detector switches prior to the zero crossing point. Thus, a negative phase shift, in effect, is introduced in the feedback loop porportional to the positive phase shift.

An alternative to providing phase shift detector 68 would be to set control logic 67 to compensate for a predetermined phase shift. This would require a prior knowledge of the amplifier phase shift and would, of course, not be as accurate in the event of changes in phase shift due to factors such as aging, moisture and temperature. It would, however, simplify the circuitry and might be acceptable where extreme accuracy in unnecessary or the actual phase shift negligible.

Figure 2:
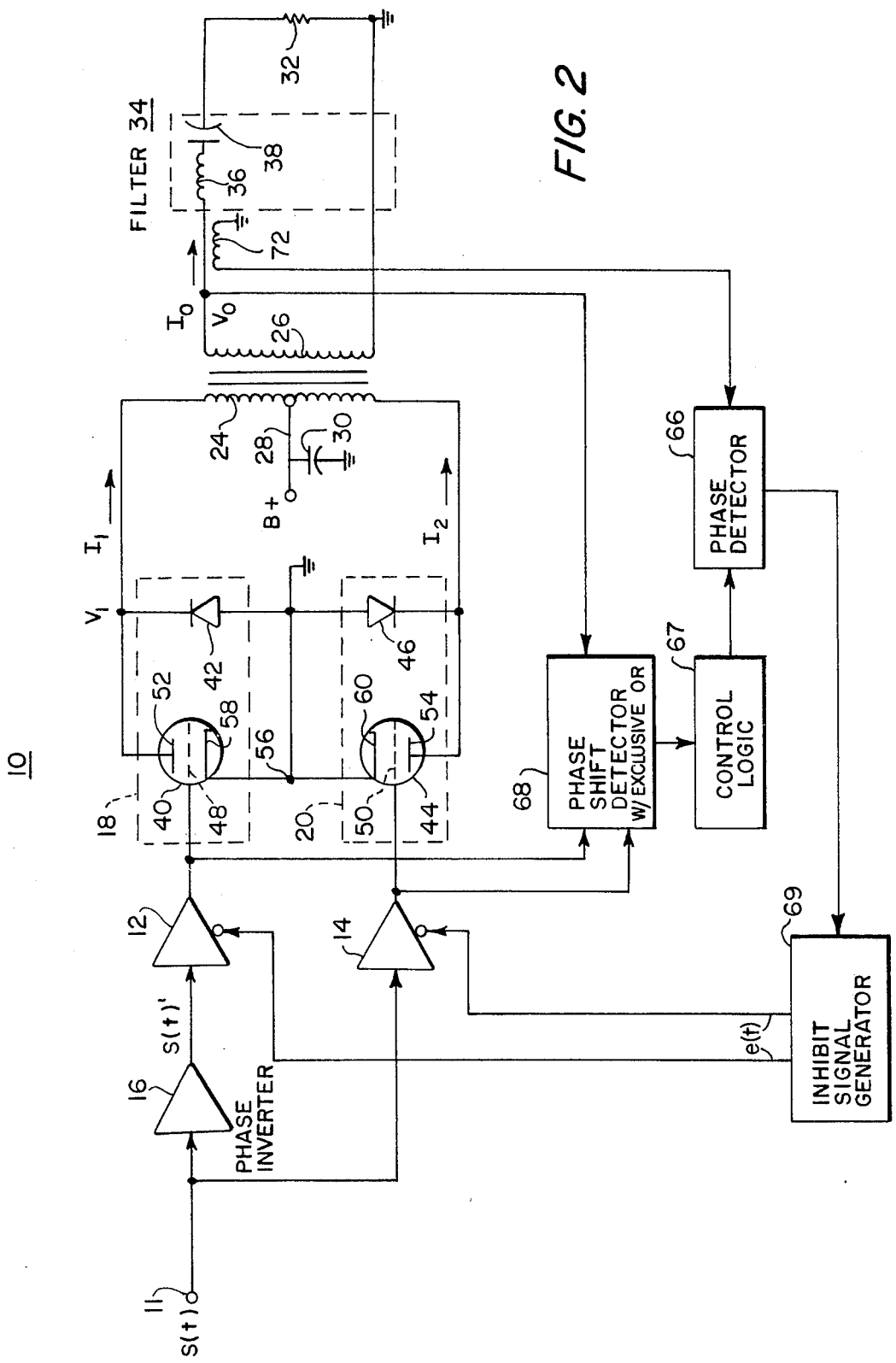
FIG. 2 shows a partial block and a partial schematic diagram of a second embodiment of a drive circuit according to the invention.

Referring now to FIG. 2, a second embodiment of the invention is illustrated, wherein the output signal is sensed by sensor 72 as output current $I_o$ at the output of secondary coil 26. The phase of $I_o$ is determined by phase detector 66 in the same manner as the phases of $I_1$ and $I_2$ were in FIG. 1. Phase shift detector 68 and control logic circuit 67 control phase detector 66 in the same manner as in FIG. 1, but here the voltage $V_o$ is used to establish the voltage delay rather than $V_1$ and $V_2$. Sensing the current at the secondary coil 26 offers the distinct advantage, particularly in Class S amplifiers, of providing a more nearly sinusoidal current waveform to sample. Also, since the combined outputs are being monitored rather that the individual outputs $I_1$ and $I_2$, there is never any problem in the phase detector as to which current to monitor. Such a problem can occur in the FIG. 1 embodiment if the phase shift in amplifier elements 18 and 20 is different.

It is especially important that the phase shift between the inputs to amplifier elements 18 and 20 and the voltage $V_o$ be established inasmuch as output transformers customarily exhibit phase shift characteristics which offset $I_o$ relative to $V_o$ and which must be compensated for to prevent switching the drive to amplifier elements 18 and 20 at the wrong moment. This phase compensation can be provided by phase shift detector 68 or presetting control logic circuit 67 in the same manner as described in the aforegoing description of FIG. 1.

The various individual elements used in both embodiment of the invention are conventional in nature. For example, phase detector 66 can simply be a zero crossing detector such as a biased Schmitt Trigger to convert the sinewave currents $I_o$ or the sum of $I_1$ and $I_2$ to square waves which switches at the zero crossing point. Other commercially available zero crossing detectors such as the Motorola MFC 8070 zero voltage switch will also serve well. Inhibit signal generator 69 can be a switching amplifier that has a square wave output and an inverted output, i.e., a second output signal that is 180° out of phase with the first signal. All the functions of phase detector 66, inhibit signal generator 69, phase shift detector 68 and control logic 67 could be performed on a minicomputer if desired. The type of switch used for drive means 12 and 14 is strictly dependent upon the drive level requirements of amplifier elements 40 and 44. Power transistors such as the Delco DTS423 silicon power transistor have proven quite successful. Vacuum tubes operating in the switching mode would also be suitable. The particular tube types and semiconductor elements that would be used in amplifier elements 18 and 20 depends upon the power level and operating frequency desired. As one example a 1 kilowatt amplifier can be built using Eimac 3-1000Z triode vacuum tubes and Unitrode UDC 7.5 diodes.

There has therefore been provided a convenient means of enhancing the drive such that drive is only applied to the side of the amplifier which is contributing to the output power while preventing the loss of capacitively stored energy and eliminating cross-over dissipation between amplifier elements. Obviously, numerous modifications and variations of the present invention are possible in light of the above teachings. It is therefore to be understood that within the scope of the appended claims the invention may be practiced otherwise than as specifically described therein.

What is claimed and desired to be secured by Letters Patent of the United States is:

1. A push-pull amplifier comprising:
    an input signal source;
    first and second switching amplifier elements coupled to said input signal source and an output providing output current signals;
    means for inverting said input signal to said first switching amplfier element 180° relative to said input signal applied to said second switching amplifier element;
    first drive means coupling the inverted input signal to said first switching amplifier element, and second drive means coupling said input signal to said second switching amplifier element, said first switching amplifier element conducting said inverted input signal only when said first drive means is enabled, and said second switching amplifier element conducting said input signal only when said second drive means is enabled;

phase detection means to detect the phase of said output current signals; and control means coupled to said phase detection means to provide control signals to enable one of said first and second drive means to conduct while inhibiting the other of said first and second drive means;

whereby said first and second switching amplifier elements will be prevented from simultaneous conduction and will conduct said input signal alternately at approximately 180° intervals.

2. A push-pull amplifier as set forth in claim 1 wherein said control means further comprises phase correction means to adjust said control signals to compensate for phase shift which occurs between said input and output of said first and second switching amplifier elements.

3. A push-pull amplifier as set forth in claim 2 wherein said phase correction means comprises:

a phase shift detector having its inputs coupled to measure the voltages at the inputs and outputs to said first and second switching amplifier means, said phase shift detector providing an output pulse whose width is indicative of the voltage delay between said measured voltages; and control logic means coupled by its input to said phase shift detector and by its output to said phase detection means, said control logic means integrating said pulse output of said phase shift detector to control said phase detection means to offset the phase of said output current signals in accordance with the measured voltage delay.

4. A push-pull amplifier as set forth in claim 3 wherein said phase shift detector comprises EXCLUSIVE OR circuits which provide an output if and only if one of the input and output voltage signals which it monitors is present.

5. A push-pull amplifier as set forth in claim 2 further comprising:

means for combining the output current signals of said first and second switching amplifier elements to provide an output current signal $I_o$; and sensor means coupling the output current signals of said first and second switching amplifier elements to said phase detector means at points prior to the means for combining whereby the phase correction means is responsive to the individual non-combined output currents of said first and second switching amplifier elements.

6. A push-pull amplifier as set forth in claim 5 wherein said control means switches the drive between said first and second drive means when said phase detector indicates a zero-crossing of the phase of either of said output current signals.

7. A push-pull amplifier as set forth in claim 5 wherein said phase correction means comprises:

a phase shift detector having its inputs coupled to measure the voltages at the inputs and outputs to said first and second switching amplifier means, said phase shift detector providing an output pulse whose width is indicative of the voltage delay between said measured voltages; and control logic means coupled by its input to said pulse shift detector and by its output to said phase detection means, said control logic means integrating said pulse output of said phase shift detector to control said phase detection means to offset the phase of said output current signals in accordance with the measured voltage delay.

8. A push-pull amplifier as set forth in claim 7 wherein said phase shift detector comprises EXCLUSIVE OR circuits which provide an output if and only if one of the input and output voltage signals which it monitors is present.

9. A push-pull amplifier as set forth in claim 1 further comprising:

means for combining the output current signals of said first and second switching amplifier elements to provide an output current signal $I_o$; and sensor means coupling the output of said combining means to said phase detection means whereby said phase detection means is responsive to the phase of said output current signal $I_o$.

10. A push-pull amplifier as set forth in claim 9 wherein said control means switches the drive between said first and second drive means when said phase detector indicates a zero-crossing of the phase of the output current signal $I_o$.

11. A push-pull amplifier as set forth in claim 9 wherein said control means further comprises phase correction means to adjust said control signals to compensate for phase shift which occurs between the inputs to said first and second switching amplifier elements output sensor means.

12. A push-pull amplifier as set forth in claim 11 wherein said phase correction means comprises:

a phase shift detector having its inputs coupled to measure the voltages at the inputs to said first and second switching amplifier means and said output sensor means, said phase shift detector providing an output pulse whose width is indicative of the voltage delay between said measured voltages; and control logic means coupled by its input to said phase detector and by its output to said phase detection means, said control logic means integrating said pulse output of said phase shift detector to control said phase detection means to offset the phase of said output current signals in accordance with the measured voltage delay.

13. A push-pull amplifier as set forth in claim 12 wherein said phase shift detector comprises EXCLUSIVE OR circuits which provide an output if and only if one of the input and output voltage signals which it monitors is present.

14. A push-pull amplifier as set forth in claim 9 wherein said combining means comprises an output transformer having a primary coil coupled to the outputs of said first and second switching amplifier elements, and a secondary coil providing said output current signal $I_o$.

* * * * *